United States Patent
Randazzo et al.

(10) Patent No.: US 6,621,299 B1
(45) Date of Patent: Sep. 16, 2003

(54) CONTROL CIRCUIT FOR POWER

(75) Inventors: Todd A. Randazzo, Colorado Springs, CO (US); Matthew J. Russell, Burnsville, MN (US); Kenneth S. Szajda, Holliston, MA (US); Jonathan A. Schmitt, Eden Prairie, MN (US); Kenneth G. Richardson, Erie, CO (US); Timothy P. McGonagle, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 224 days.

(21) Appl. No.: 09/849,640

(22) Filed: May 4, 2001

(51) Int. Cl.[7] ............................................. H03K 19/00
(52) U.S. Cl. ............................. 326/80; 326/56; 326/16
(58) Field of Search ............................. 326/56–58, 62, 326/63, 80, 16

(56) References Cited

U.S. PATENT DOCUMENTS

| | | | | |
|---|---|---|---|---|
| 4,472,647 A | * | 9/1984 | Allgood et al. | 307/475 |
| 5,883,528 A | * | 3/1999 | Kashmiri et al. | 326/71 |
| 6,292,025 B1 | * | 9/2001 | Okumura | 326/58 |

* cited by examiner

*Primary Examiner*—Anh Tran
(74) *Attorney, Agent, or Firm*—Luedeka, Neely & Graham, P.C.

(57) ABSTRACT

An integrated circuit having input output buffers, where the integrated circuit is powered by at least a core power supply and an input output power supply. A level shifter receives an active low signal that indicates that the core power supply has powered down. The level shifter then outputs a known state upon receipt of the active low signal. A control circuit receives the known state form the level shifter, and then tristates the input output buffers upon receipt of the known state.

17 Claims, 3 Drawing Sheets

CONTROL CIRCUIT FOR POWER

FIELD

This invention relates to the field of integrated circuits. More particularly this invention relates to protecting integrated circuits that have more than one voltage supply.

BACKGROUND

Traditionally, all of the various components of an integrated circuit were powered from a single power source. Because all of the components were powered from the common power source, very little thought needed to be given to the effects that one component may have on another component if one of the components was powered off and the other components were powered on. This was because all of the components tended to either be powered on together or powered off together.

However, in more recent technologies, different components of an integrated circuit, such as a complimentary metal oxide semiconductor integrated circuit, are powered separately from different voltage sources. These different voltage sources have the capacity to operate independently from each other. For example, a voltage source that powers one set of components on the integrated circuit may be powered off, while a different voltage source that powers another set of components on the integrated circuit may be powered on. Thus, with different and independent voltage sources powering different portions of the integrated circuit, it becomes desirable to understand and provide for the interactions that may occur between different sets of components that are powered by the different voltage sources.

For example, in some new technologies the core of an integrated circuit, such as the memory or logic components, is powered off one voltage source, and the input output components of the integrated circuit are powered off of a different voltage source. Typically, a multi-supply integrated circuit, or in other words an integrated circuit that is powered by more than one voltage source, uses a level translator to step signals up from the core voltage levels to the input output voltage levels. Typically, the core voltage level is nominally 1.5 volts and the input output voltage level is nominally 3.3 volts.

The level translators, also called voltage level shifters, tend to have certain properties in common. One commonly shared property is that they tend to output an indeterminate state when the voltage source to the core is powered off. In other words, the shifters may provide on their outputs a logical low voltage, a logical high voltage, or a voltage that is somewhere in between when the core is powered off. Further, the shifters tend to not all have the same state on their output, but rather the many different shifters used in an integrated circuit tend to exhibit many different states, seemingly without any predictable pattern for the states that they exhibit.

Because the output of the shifters is unpredictable in this situation, the input output buffers, which are set according to the level of the output from the shifters, are also in an unpredictable state. In other words, depending upon the level of output from the shifters, the input output buffers may be driving high, driving low, or tristated. When in a tristate mode, the input output buffers are effectually electrically disconnected from other input output lines to which they are logically connected. Thus, in these multi powered integrated circuit designs, when the core power is gone, the input output buffers are left in an unknown state.

Having the input output buffers in an unknown state is generally an undesirable condition. For example, if the input output buffers are driving a state that is in conflict with another integrated circuit in the system, it could draw the short circuit current of the driver for a long period of time. This situation poses a reliability risk, not only for the integrated circuit for which the input output buffers are in an unknown state, but also for any other integrated circuit on the same system buss.

Further, when the input output buffers are in indeterminate states, such as when the core is powered down as described above, there tends to be additional reliability issues in regard to electrostatic discharge. Using the example of a conventional CMOS output buffer, a high going pin to VSS pulse typically powers up VDDIO through the p+ to n well diode. Thus, VDDIO is powered and VDDCORE is absent. At this point the level shifters have indeterminate outputs, as described above. Depending upon the predriver logic, the driver device may turn on and be damaged by the electrostatic discharge pulse:

Thus, for the various reasons as given above, it is desirable that the input output buffers not be left in an indeterminate state when the core voltage is powered off. Some integrated circuit manufacturers provide for this situation by specifying constraints on the system in terms of how power supplies must be sequenced on and off. Unfortunately, system designers tend to use integrated circuits from many different integrated circuit manufacturers, which integrated circuits further tend to have conflicting requirements for their power sequencing protocols. In some cases it may be impossible for the system designer to guarantee that different power supplies come up in a sequence specified by the integrated circuit manufacturer.

What is needed, therefore, is a system whereby the output of the voltage shifters is left in a known state when the core voltage source is powered off, so that the input output buffers can likewise be left in a known state when power to the core is lost.

SUMMARY

The above and other needs are met by an integrated circuit having input output buffers, where the integrated circuit is powered by at least a core power supply and an input output power supply. A level shifter receives an active low signal that indicates that the core power supply has powered down. The level shifter then outputs a known state upon receipt of the active low signal. A control circuit receives the known state form the level shifter, and then tristates the input output buffers upon receipt of the known state.

In this manner, the input output buffers are tristated upon powering down of the core power supply, rather than being left in an indeterminate state as a result of the indeterminate output of the prior art level shifters. In various preferred embodiments, the active low signal is an IDDT test mode signal, the known state is a low state, and the control circuit is at least one nand gate. Preferably, the level shifter draws no direct current other than leakage current upon receipt of the active low signal. Most preferably, the control circuit is operable to tristate all of the input output buffers on the integrated circuit, while in other embodiments each of the input output buffers on the integrated circuit is tristated by a dedicated control circuit and level shifter pair.

In another aspect of the invention there is provided a method of tristating input output buffers of an integrated circuit, where the integrated circuit is powered by at least a core power supply and input output power supply. An active low signal is generated, which active low signal indicates that the core power supply has powered down. The active low signal is received with a level shifter, which outputs a known state upon receipt of the active low signal. The known state is received with a control circuit, which tristates the input output buffers upon receipt of the known state.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
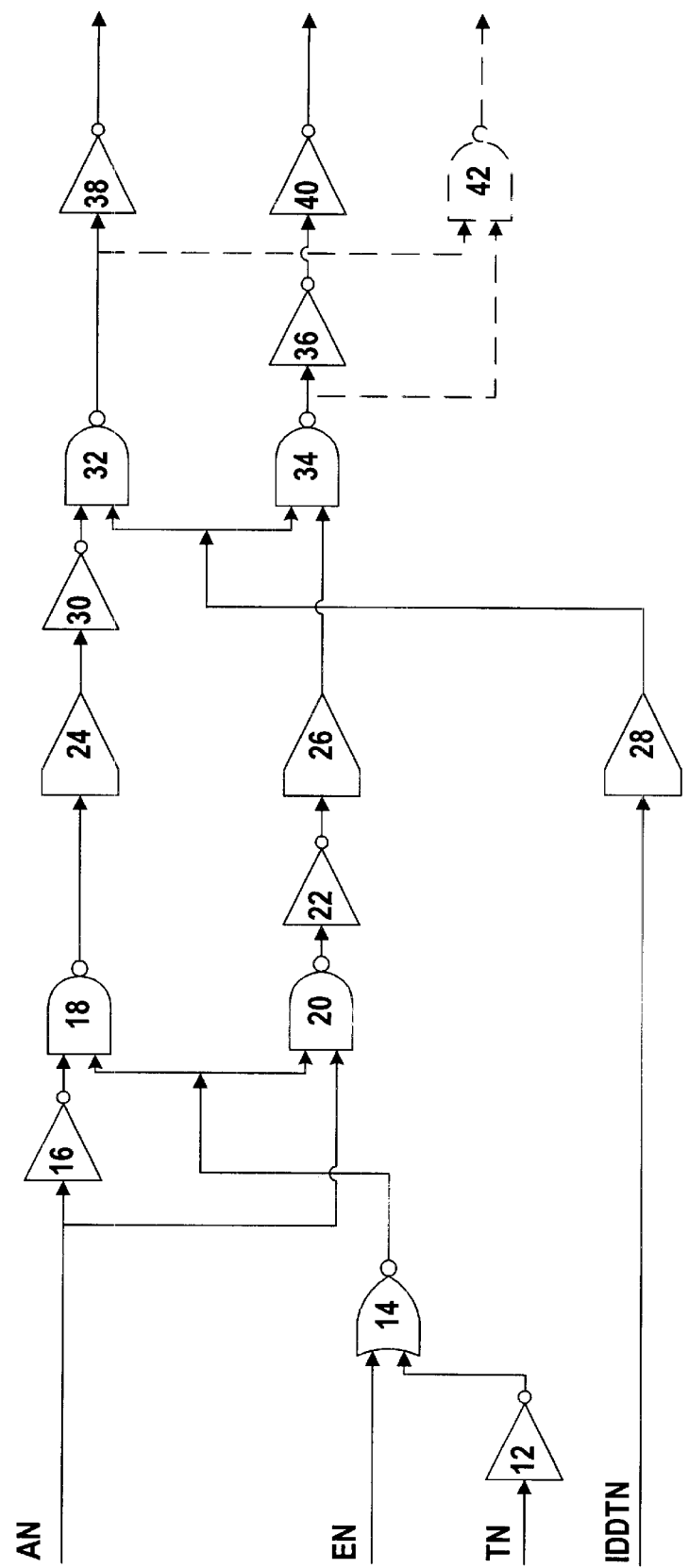
FIG. 1 is a logic diagram of a circuit for tristating the input output buffers upon power down of the core, according to the present invention.

Referring now to FIG. 1, there is depicted a logic diagram of a circuit for tristating the input output buffers of an integrated circuit when the core voltage powers down. As depicted in FIG. 1, voltage level shifters 24 and 26 shift the voltage from a core voltage to an input output voltage. In the preferred embodiment the core voltage on the input of the shifters 24 and 26 is 1.5 volts and the input output voltage on the output of the shifters 24 and 26 is 3.3 volts. However, these values are representational only, and in actual practice other core voltages and input output voltages could be used.

As a part of the invention, the shifted output voltages from the shifters 24 and 26 are processed with a controlling signal in nand gates 32 and 34. Thus, if the controlling signal provided on the output of level shifter 28 is at a logical low, then the outputs of the nand gates 32 and 34 will likewise be a logical low value, regardless of the value of signal at the outputs of shifters 24 and 26. Thus, when the output of the level shifters 24 and 26 is unknown, such as when the core voltage is powered down, the output of the nand gates 32 and 34 can be put in a known state, such as a logical low, by providing a logical low at the output of the level shifter 28. Thus, the level shifter 28 provides a control signal for a control circuit that includes nand gates 32 and 34, which output the signals that selectively cause the input output circuits of the integrated circuit to drive high, drive low, or tristate.

Thus, the circuit of FIG. 1 provides the ability to positively set the state of the input control lines for the input output circuits of the integrated circuit. As described above, the state of the input output control lines is preferably set to a logical low when the core voltage is powered down, which logical low preferably is preferably used to tristate the input output circuits. However, it is appreciated that in alternate embodiments it may be desirable to drive the input output circuits either high or low for some reason, and the circuit as described above may be easily modified to achieve those alternate embodiments.

As depicted, the circuit of FIG. 1 is somewhat similar to prior art driver circuits, and thus there is relatively little modification that is needed to modify a prior art driver circuit to the embodiment as depicted in FIG. 1. For example, a prior art driver circuit can be modified with the addition of the shifter 28, nand gates 32 and 34, and inverter 36. Thus, a prior art driver would have the output of the inverter 30 connected to the input of the inverter 38, and the output of the shifter 26 connected to the input of the inverter 40. Therefore, only a few additional elements need to be added to the driver circuit to implement the invention as described herein and receive the resultant benefits. Thus, the solution is small enough to fit in each input output block, which avoids a change to the construction methodology of the integrated circuit. Further, the solution adds minimal complexity to the basic operation of the high performance input output drivers.

As depicted in FIG. 1, there are at least two strategic elements to the design of the circuit. First is the use of IDDTN as the control signal on the input of the shifter 28, and the second is the shifter 28 itself. As mentioned above, the output of the shifters 24 and 26 are unknown when the core voltage powers down. However, it is preferred that the output of the shifter 28 be known to be a specific logical value, most preferably a logical low, when the core voltage powers down. Thus, the shifter 28 is preferably of a different construction from the design of the traditional shifters 24 and 26.

Figure 3:
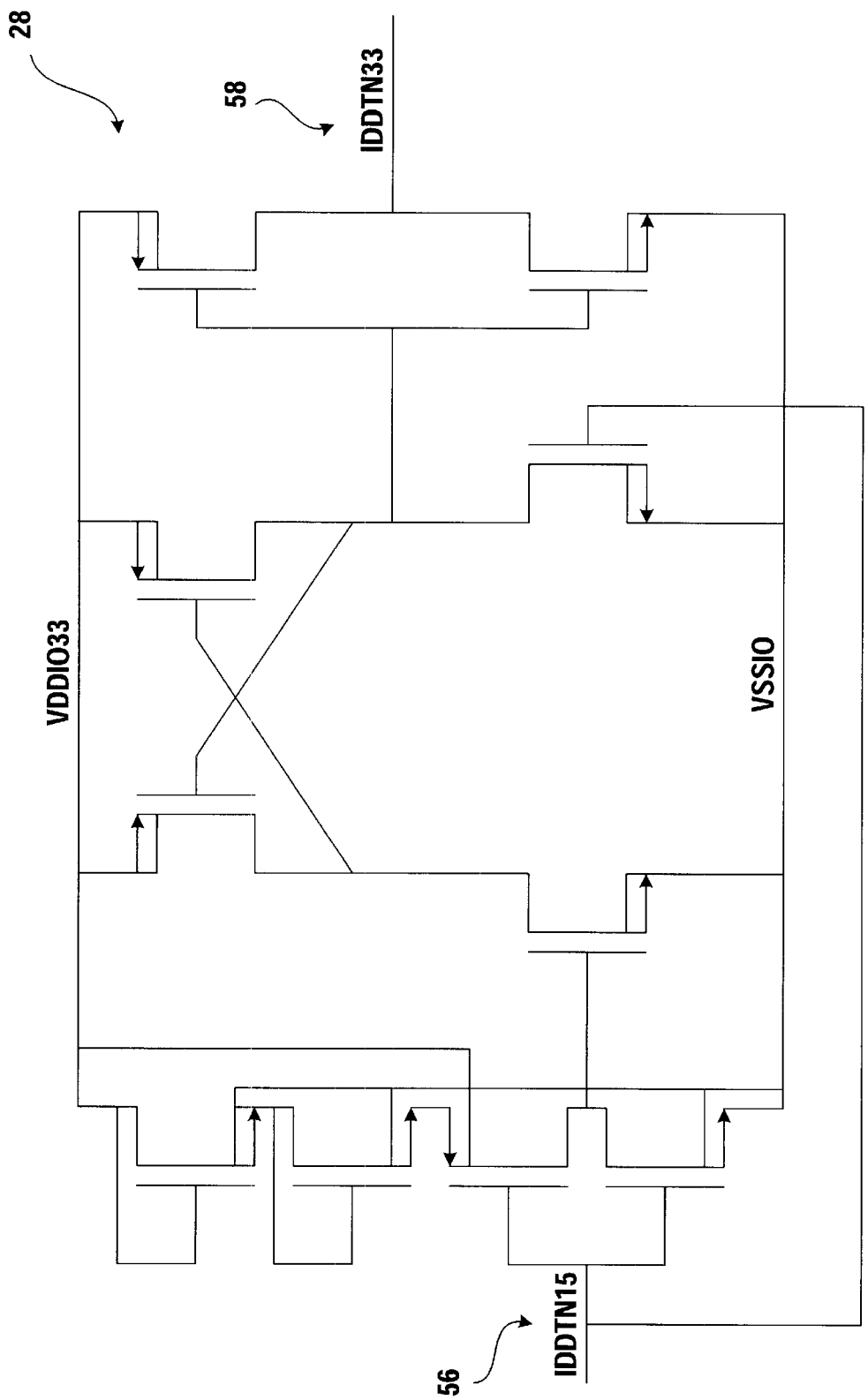
FIG. 3 is a circuit diagram of a shifter for use in the circuit of FIG. 1.

FIG. 3 depicts a circuit diagram of the shifter 28. As can be seen from the design of the shifter 28, when the input IDDTN15 56, which is at a logical high of nominally 1.5 volts, goes low, such as in a core voltage power down condition, the voltage shifted output IDDTN33 58 will also go to a logic low, and not be left in an indeterminate logical state, as is possible with traditionally designed voltage shifters 24 and 26. Thus, voltage shifter 28 enables the setting of a known and specified control signal output to the input output driver control circuits.

In an alternate embodiment, the voltage shifters 24 and 26 may be replaced in a traditional design with the voltage shifter 28. In this embodiment, no change to the overall design of the input output driver circuit is necessary, because the dual voltage shifters 28 output a known low state rather than an unknown indeterminate state when the in cover voltage at the input powers down. However, because the design of the voltage shifter 28 is somewhat more complex than the design of the voltage shifters 24 and 26, it may be preferably to use the overall circuit design as depicted in FIG. 1. For example, the additionally complexity of the shifter 28 tends to make it somewhat slower than the shifters 24 and 26, which may impair the fast switching of the high performance shifters 24 and 26 in normal operation.

The voltage shifter 28 is very beneficial in that it draws very little direct current, typically less than 100 nanoamps. Further, the voltage shifter 28 draws no static IDD when the integrated circuit is in IDD test mode, or in other words when IDDTN is at a logical low. The shifter 28 provides a logical low on its output 58 within a few nanoseconds of loss of the core voltage on this input 56. Although this is typically not as fast as the switching of the shifters 24 and 26, this length of time tends to be fast enough to satisfy the purposes of the shifter 28, which is to preferably tristate the input output buffers.

As mentioned above, the use of IDDTN as the input control is especially preferred. There are several reasons for this. The IDDTN is active low and passes through logic gates powered off of the core voltage supply. Further, the IDDTN comes from a signal that is generally present throughout the integrated circuit, and thus is readily available without undue restructuring of the integrated circuit.

Figure 2:
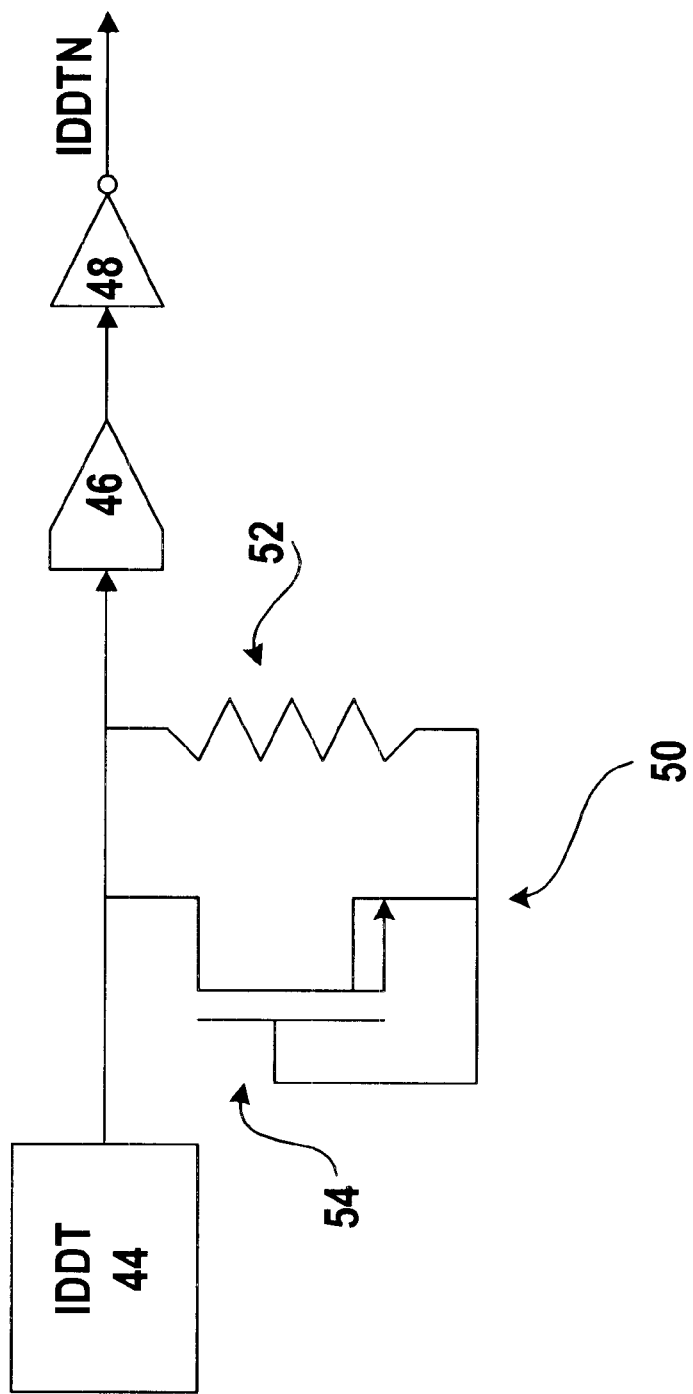
FIG. 2 is a combined logic and circuit diagram of a circuit for providing an input to the circuit of FIG. 1.

FIG. 2 depicts a pad cell 50 for establishing IDDTN from an active low IDDT test mode signal 44. The elements depicted in FIG. 2 include a standard nominal 3.3 volt to 1.5 volt level shifter 46, an inverter 48, a resistor 52, such as a 20 kohm p+ polysilicon resistor, and a gate 54.

Thus, the circuits described above provide the ability to tristate the input output circuits when the core voltage is powered down. The circuits make use of a signal that is typically available, and which requires minimal power when the integrated circuit is running in a normal mode. The circuit adds no static Idd when the integrated circuit is in static Idd test mode, or in other words when the input to the shifter 28 is low. Further, the circuit protects the input output from short circuit currents that can occur when core voltage is lost and input output supply remains. Finally, the circuit reduces or eliminates the electrostatic sensitivity to predriver logic inversions.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of tristating input output buffers of an integrated circuit that is powered by at least a core power supply and an input output power supply, comprising the steps of:

generating an active low signal, which active low signal indicates that the core power supply has powered down, receiving the active low signal with a level shifter, where the active low signal is not received on the core power supply, outputting a known state with the level shifter upon receipt of the active low signal, receiving the known state with a control circuit, and tristating the input output buffers with the control circuit upon receipt of the known state.

2. The method of claim 1, wherein the active low signal further comprises an IDDT test mode signal.

3. The method of claim 1, wherein the known state is a low state.

4. The method of claim 1, wherein the control circuit is at least one nand gate.

5. The method of claim 1, wherein the level shifter upon receipt of the active low signal draws no direct current other than leakage current.

6. The method of claim 1, wherein the control circuit is operable to tristate all of the input output buffers on the integrated circuit.

7. The method of claim 1, wherein each of the input output buffers on the integrated circuit is tristated by a dedicated control circuit and level shifter pair.

8. An integrated circuit employing the method of claim 1.

9. An integrated circuit having input output buffers, the integrated circuit powered by at least a core power supply and an input output power supply, the integrated circuit having an improvement comprising:

a level shifter for receiving an active low signal that indicates that the core power supply has powered down where the active low signal is not received on the core power supply, the level shifter further for outputting a known state upon receipt of the active low signal, and a control circuit for receiving the known state from the level shifter, the control circuit further for tristating the input output buffers upon receipt of the known state.

10. The integrated circuit of claim 9, wherein the active low signal further comprises an IDDT test mode signal.

11. The integrated circuit of claim 9, wherein the known state is a low state.

12. The integrated circuit of claim 9, wherein the control circuit is at least one nand gate.

13. The integrated circuit of claim 9, wherein the level shifter upon receipt of the active low signal draws no direct current other than leakage current.

14. The integrated circuit of claim 9, wherein the control circuit is operable to tristate all of the input output buffers on the integrated circuit.

15. The integrated circuit of claim 9, wherein each of the input output buffers on the integrated circuit is tristated by a dedicated control circuit and level shifter pair.

16. An integrated circuit having input output buffers, the integrated circuit powered by at least a core power supply and an input output power supply, the improvement comprising:

a level shifter for receiving an active low IDDT test mode signal that indicates that the core power supply has powered down, the level shifter further for outputting a low state upon receipt of the active low IDDT test mode signal, and a control circuit having a nand gate for each input output buffer, the control circuit for receiving the low state from the level shifter, the control circuit further for tristating the input output buffers upon receipt of the low state.

17. The integrated circuit of claim 16, wherein the level shifter is configured to draw no direct current other than leakage current.

* * * * *